(12) United States Patent
Shenoy

(10) Patent No.: US 9,270,226 B2
(45) Date of Patent: Feb. 23, 2016

(54) NONINVASIVE MONITORING OF A PHOTOVOLTAIC SYSTEM

(75) Inventor: Pradeep S. Shenoy, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 747 days.

(21) Appl. No.: 13/603,193

(22) Filed: Sep. 4, 2012

(65) Prior Publication Data

US 2014/0067298 A1   Mar. 6, 2014

(51) Int. Cl.
*G01R 19/00*   (2006.01)
*H02S 50/10*   (2014.01)

(52) U.S. Cl.
CPC ..................... *H02S 50/10* (2014.12)

(58) Field of Classification Search
CPC ........................................ H02S 50/10
USPC .......................................... 702/64
See application file for complete search history.

(56) References Cited

U.S. PATENT DOCUMENTS

| | | | |
|---|---|---|---|
| 2010/0207455 A1* | 8/2010 | Erickson et al. | 307/82 |
| 2011/0031816 A1 | 2/2011 | Buthker et al. | |
| 2011/0115297 A1 | 5/2011 | de Waal et al. | |
| 2012/0091800 A1 | 4/2012 | Shenoy et al. | |
| 2012/0098344 A1 | 4/2012 | Bergveld et al. | |
| 2012/0249167 A1* | 10/2012 | Buiatti | 324/658 |

OTHER PUBLICATIONS

Shimizu, Hirakata, Kamezawa and Watanabe; "Generation Control Circuit for Photovoltaic Modules", May 2001, IEEE Transactions on Power Electronics, vol. 16 No. 3 pp. 293-300.*
"Differential Power Processing Architecture for Increased Energy Production and Reliability of Photovoltaic Systems," in Proc. IEEE Applied Power Electronics Conference and Exposition, pp. 1987-1994, Feb. 5-9, 2012 (Shenoy, et al..).

* cited by examiner

*Primary Examiner* — Mischita Henson
*Assistant Examiner* — Stephanie Bloss
(74) *Attorney, Agent, or Firm* — John R. Pessetto; Frank D. Cimino

(57) ABSTRACT

A method for determining a photovoltaic (PV) current from each of a plurality of PV elements arranged in a differential network is provided. The differential network is controlled with a plurality of control signals, where the differential network includes a plurality of inductors, and each control signal has a duty cycle. A plurality of controller parameters is received from the plurality of differential controllers. The PV current for each of the plurality of PV elements is calculated from the plurality of inductor currents and the duty cycle for each control signal.

19 Claims, 3 Drawing Sheets

NONINVASIVE MONITORING OF A PHOTOVOLTAIC SYSTEM

TECHNICAL FIELD

The invention relates generally to power generation using a photovoltaic (PV) system and, more particularly, to noninvasive monitoring of a PV system.

BACKGROUND

PV systems are becoming increasingly popular for power generation in part because of low maintenance cost, and an example of conventional PV generators 100-A and 100-B can be seen in FIGS. 1 and 2. In these examples, the PV elements 102-1 to 102-N are coupled together in a string (i.e., in series with one another) in a differential network 110-A and 110-B. The PV elements 102-1 to 102-N can be individual cells, strings of cells, panels (which would include multiple cells), strings of panels, and so forth. The differential network 110-A and 110-B can be employed with the PV generators 100A, 100B so as perform balancing (e.g., maximum power point tracking or MPPT) among the elements (e.g., 102-1 to 102-N) with differential converters. As shown, there are PV elements 102-1 to 102-N arranged in a sequence such that the first PV element (i.e., 102-1) and last PV element (i.e., 102-N) are coupled to central converter 106 (which can, for example, be a direct-current-to-alternating-current (AC/DC) converter or a direct-current-to-direct-current (DC/DC) converter). The differences between generators 100-1 and 100-B, though, lies in the topology of the DC/DC converters.

Turning first to FIG. 1, the differential converters are arranged as DC/DC converters. As such, there are intermediate nodes ND-1 to ND-(N−1) between PV elements 102-1 to 102-N, and coupled to each intermediate node ND-1 to ND-(N−1) is an inductor L-1 to L-(N−1). Each of these inductors L-1 to L-(N−1) is also coupled to a switching node SW-1 to SW-(N−1), which, as shown in this example, are between switch pairs S-1,1/S-1,2 to S-(N−1),1/S-(N−1),2. The inductors L-1 to L-(N−1) and switch pairs SA-1,1/SA-1,2 to SA-(N−1),1/SA-(N−1),2 together with the corresponding DC/DC controllers 104-1 to 104-(N−1) form the DC/DC converters (which can, for example, be buck converters, boost converters, or buck-boost converters) that allow for balancing.

Alternatively, the differential converters can be arranged as flyback converters as shown in FIG. 2, or forward converters (not shown). In the example configuration of FIG. 2, the primary sides of transformers TR-1 to TR-N are respectively coupled across PV elements 102-1 to 102-N, with conduction across the primary sides of transformers TR-1 to TR-N being controlled by switches SB-1,2 to SB-N,2, respectively. The secondary sides of each of transformers TR-1 to TR-N are coupled across the central converter 106 with conduction across the secondary sides of transformers TR-1 to TR-N being controlled by switches SB-1,1 to SB-N,1. The switches SB-1,1 to SB-N,1 and SB-1,2 to SB-N,2 are controlled by flyback controllers 108-1 to 108-N in local controller 108-B.

Balancing, while useful, may prove to be insufficient. Utility scale power generation stations may include hundreds of thousands of PV elements (e.g., 102-1 to 102-N), and, in order to obtain close to optimal performance, close monitoring of the elements (e.g., 102-1 to 102-N) may be desirable. Shade (e.g., from dust) or damage (e.g., from hail) may cause one or more of the elements (e.g., 102-1 to 102-N) to operate at a less than desirable level. Manually checking each individual element (e.g., 102-1 to 102-N) is costly in terms of labor and other costs, so it is desirable to be able to automatically monitor the elements (e.g., 102-1 to 102-N). Monitoring, though, typically implies measurement of the PV current for each of the elements (e.g., 102-1 to 102-N), and this monitoring has transitionally been accomplished with invasive sensors (e.g., sense resistors inserted into the strings), which can be costly, increase energy losses, and be difficult to manage by themselves.

Therefore, there is a need for a method and/or apparatus for monitoring PV elements.

Some examples of conventional systems are: U.S. Patent Pre-Grant Publ. No. 2011/0115297; U.S. Patent Pre-Grant Publ. No. 2012/0098344; U.S. Patent Pre-Grant Publ. No. 2011/0031816; U.S. Patent Pre-Grant Publ. No. 2012/0091800; and Shenoy et al., "Differential power processing architecture for increased energy production and reliability of photovoltaic systems," in *Proc. IEEE Applied Power Electronics Conference and Exposition*, pp. 1987-1994, 5-9 Feb. 2012.

SUMMARY

In accordance with the present invention, a method for determining a photovoltaic (PV) current from each of a plurality of PV elements arranged in a differential network is provided. The method comprising: controlling the differential network with a plurality of control signals, wherein the differential network includes a plurality of inductors, and wherein each control signal has a duty cycle; receiving a plurality of controller parameters from the plurality of differential controllers; and calculating the PV current for each of the plurality of PV elements from the plurality of inductor currents and the duty cycle for each control signal.

In accordance with the present invention, the plurality of controller parameters further comprises a plurality of inductor current measurements, and wherein each inductor current measurement is associated with at least one of the plurality of inductors.

In accordance with the present invention, the plurality of inductor current measurements further comprises a plurality of digital inductor current measurements, and wherein the method further comprises: measuring the plurality of inductor currents to generate a plurality of analog inductor current measurements; and digitizing the plurality of analog inductor current measurements so as to generate the plurality of digital inductor current measurements.

In accordance with the present invention, the step of calculating further comprises multiplying an input vector by a matrix so as to generate an output vector, wherein the vector includes the plurality of digital inductor current measurements, and wherein matrix includes matrix elements corresponding to the duty cycle for each control signal used to control the differential network, and wherein the output vector includes the plurality of PV currents.

In accordance with the present invention, the step of controlling further comprises generating the plurality of control signals with a plurality of direct-current-to-direct-current (DC/DC) controllers.

In accordance with the present invention, the steps of measuring and digitizing are performed by the plurality of DC/DC converters.

In accordance with the present invention, the plurality of inductors further comprises a plurality of sets of inductors, and wherein the plurality of controller parameters further comprises a plurality of converter output current measurements.

In accordance with the present invention, each set of inductors form a transformer, and wherein the step of controlling further comprises generating the plurality of control signals with a plurality of flyback controllers, and wherein the steps of measuring and digitizing are performed by the plurality of flyback converters.

In accordance with the present invention, an apparatus is provided. The apparatus comprises a local power controller that is configured to be coupled to a differential network having a plurality of inductors and a plurality of PV elements; and a processor with a non-transitory memory having a computer program embodied thereon, the processor being coupled to the local power controller, and wherein the computer program product includes: computer code for receiving a plurality of converter parameters for the differential network; computer code for multiplying an input vector by a matrix so as to generate an output vector, wherein the vector includes the plurality of inductor current measurements, and wherein matrix includes matrix elements corresponding to a duty cycle for each control signal from the local power controller used to control the differential network, and wherein the output vector includes a plurality of PV currents, and wherein each PV current is associated with at least one of the plurality of PV elements; and computer code for transmitting a digital signal to a monitoring network.

In accordance with the present invention, the plurality of converter parameters further comprises a plurality of digital inductor current measurements, and each inductor current measurement is associated with at least one of the plurality of inductors, and wherein the local power controller is configured to: measure the plurality of inductor currents to generate a plurality of analog inductor current measurements; and digitize the plurality of analog inductor current measurements so as to generate the plurality of digital inductor current measurements.

In accordance with the present invention, the local power controller further comprises a plurality of DC/DC controllers that are configured to generate the plurality of control signals.

In accordance with the present invention, the plurality of converter parameters further comprise a plurality of converter output current measurements, and wherein the plurality of inductors further comprises a plurality of sets of inductors, and wherein each set of inductor forms a transformer, and wherein the local power controller further comprises a plurality of flyback controllers that are configured to generate the plurality of control signals.

In accordance with the present invention, an apparatus is provided. The apparatus comprises a central converter; a differential network having: a plurality of PV elements coupled in series with one another in a sequence, wherein the plurality of PV elements are coupled to one another at a plurality of intermediate nodes, and wherein the first and last PV elements of the sequence are coupled to the central converter; a plurality of inductors; and a plurality of pairs of switches; a local power controller that is coupled to the differential network so as to control each of the pairs of switches, and wherein the local power controller, the plurality of inductors and the plurality of pairs of switches are arranged to form a plurality of differential converters; and a monitor that is coupled to the local power controller, wherein the monitor is configured to: receive a plurality of converter parameters for the differential network; multiply an input vector by a matrix so as to generate an output vector, wherein the vector includes the plurality of inductor current measurements, and wherein matrix includes matrix elements corresponding to a duty cycle for each control signal from the local power controller used to control the differential network, and wherein the output vector includes a plurality of PV currents, and wherein each PV current is associated with at least one of the plurality of PV elements; and transmit a digital signal to a monitoring network.

In accordance with the present invention, each inductor is coupled to at least one of the intermediate nodes, and wherein each pair of switches has a switching node, and wherein each switching node is coupled to at least one of the inductors In accordance with the present invention, the monitor is a processor with a non-transitory memory having a computer program embodied thereon.

In accordance with the present invention, the central converter further comprises a direct-current-to-alternating-current (DC/AC) converter.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
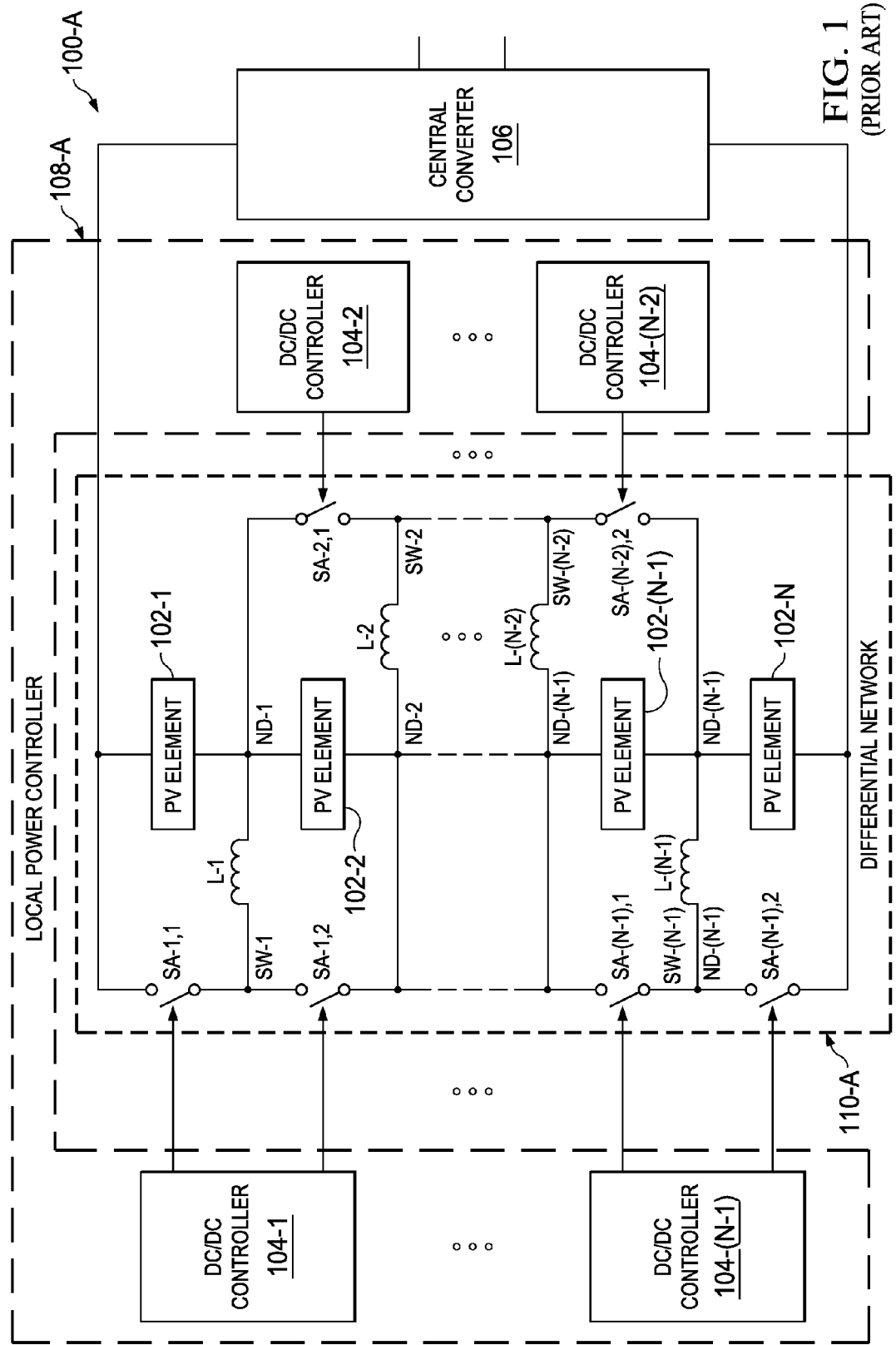
FIGS. 1 and 2 are an examples of conventional PV generators.
Figure 2:
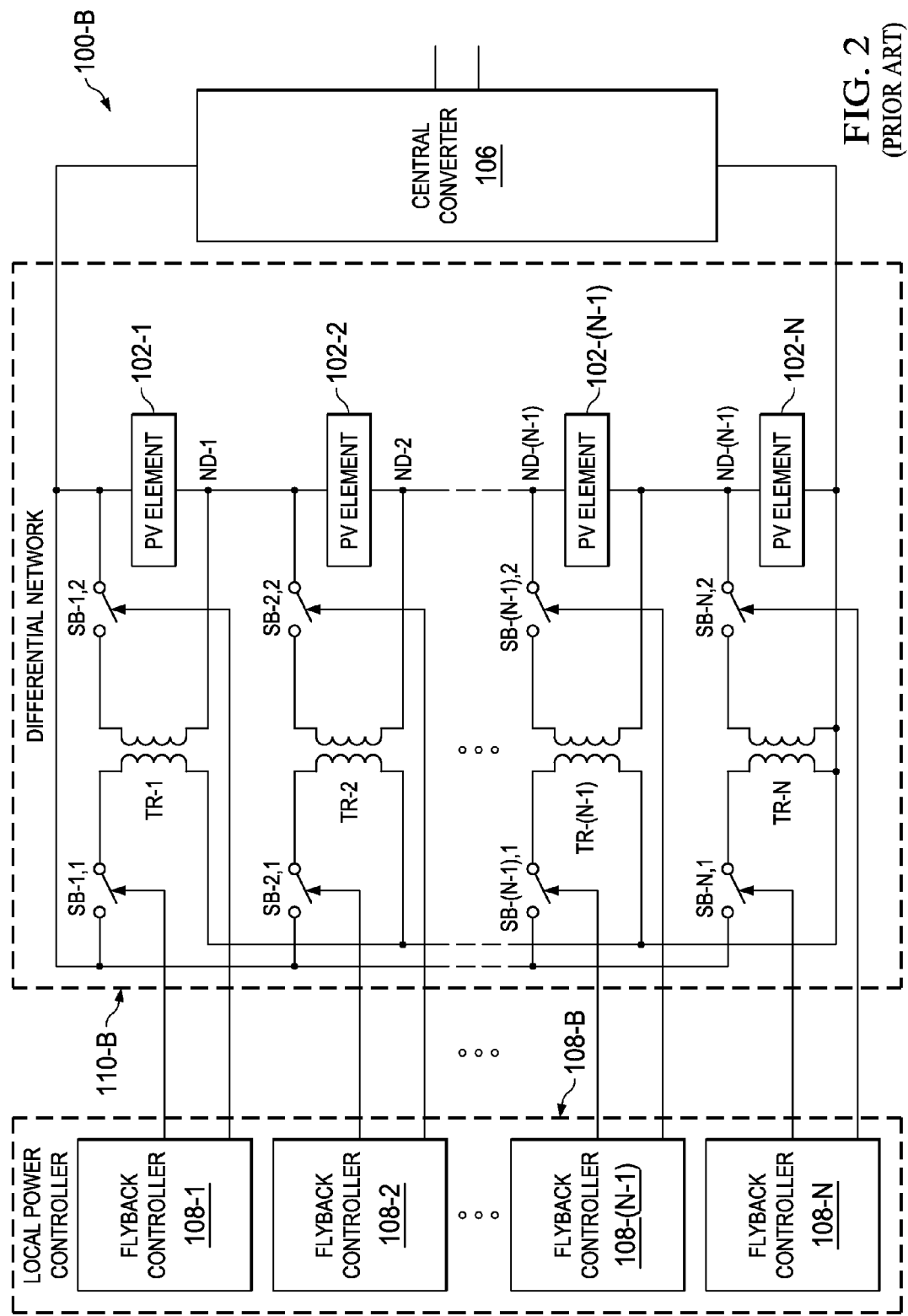

Refer now to the drawings wherein depicted elements are, for the sake of clarity, not necessarily shown to scale and wherein like or similar elements are designated by the same reference numeral through the several views.

Figure 3:
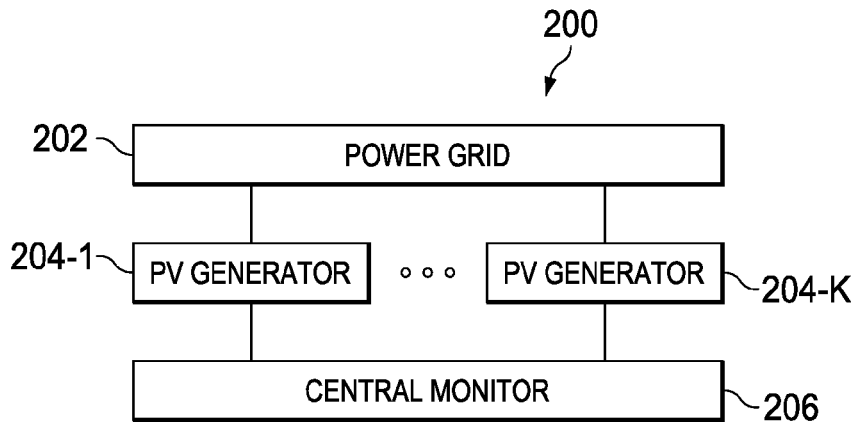
FIG. 3 is a diagram of an example of a system in accordance with the present invention.

Turning to FIG. 3, an example power generation system 200 can be seen. As shown, there are PV generators 204-1 to 204-K that are coupled to provide AC power to the power grid 202. These PV generators 204-1 to 204-K, in this example, can be monitored by central monitor 206. Typically, the PV generators 204-1 to 204-K and central monitor 206 can be referred to as a power station. The monitoring system 204 can also include other control and interface systems that allow the PV generators 204-1 to 204-K to be able to provide AC power to the power grid 202.

Figure 4:
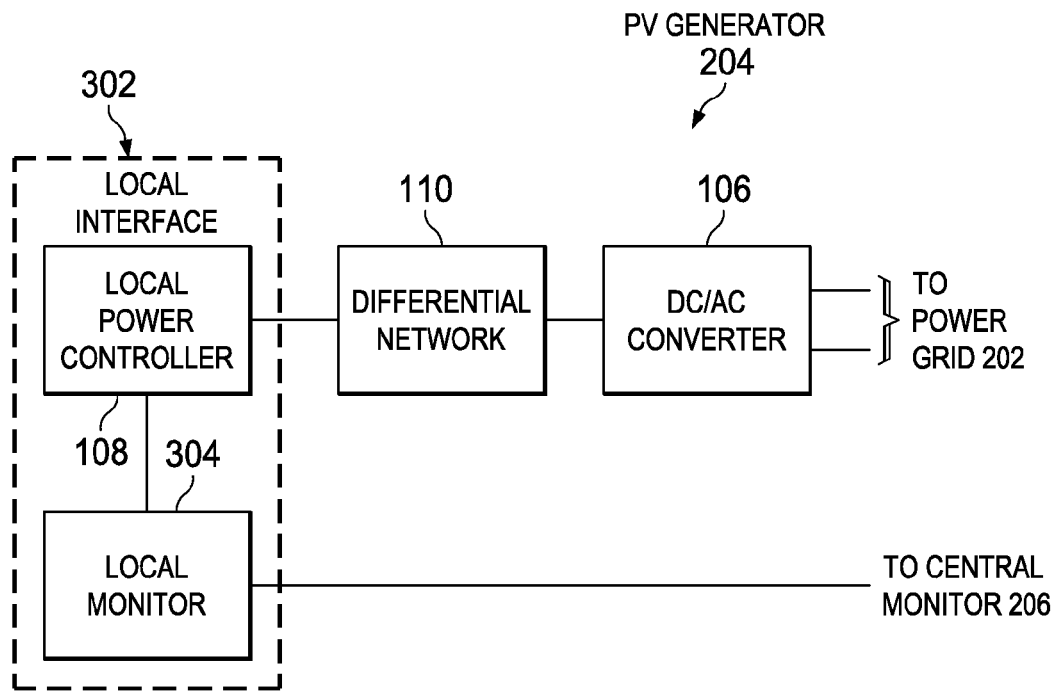
FIG. 4 is a diagram of an example of a PV generator of FIG. 3.

In FIG. 4, the PV generators 204-1 to 204-K (labeled 204) can be seen in greater detail. As shown, the PV generator 204 is similar in structure to that of PV generators 100-A and 100-B, but the local power controller 108-A or 108-B has been replaced by a local interface 302. The local interface 302 includes a local power controller 108 (which can, for example, be controller 108-A or 108-B) and a local monitor 304. This local interface 302 can be comprised of a single integrated circuit (e.g., microprocessor or microcontroller), a single unit (e.g., local monitor 304 and DC/DC controllers 104-1 to 104-(N−1) are co-located), or a distributed network. As part of their normal operation, the differential controllers (e.g., DC/DC controllers 104-1 to 104-(N−1) or flyback controllers 108-1 to 108-N) measure inductor currents (which can be represented as $I_{L-1}$ to $I_{L-(N-1)}$ for differential network 110-B). Typically, the differential controllers (e.g., DC/DC controllers 104-1 to 104-(N−1) or flyback controllers 108-1 to 108-N) can perform an analog measurement (e.g., with sense transistors) and digitize the values. These digitized inductor currents (e.g., $I_{L-1}$ to $L_{L-(N-1)}$) can then be provided to the local monitor 304. The local monitor 304 can, for example, be comprised of logic or a processor (e.g, microcontroller) with a non-transitory memory (e.g., random access memory or non-volatile memory) having a computer program embodied thereon. This local monitor 304 can then calculate the PV currents without the use of any invasive current sensors. It should also be noted that the local power controller and differential network have, respectively, been denoted as 108 and 110 so as to refer to a generic network that can, respectively, include controllers 108-A and 108-B and networks 110-A and 110-B.

While on its face, calculation of these PV current may appear to be trivial; that is not the case. It had not been recognized, thus far, that a matrix, which is dependent on the topology of the differential network 110, could be constructed to perform this calculation. For example, the matrix for differential network 110-A will be different from that of differential network 110-B. Because of the nature of the topology of the differential network, the PV currents (e.g., for elements 102-1 to 102-N) can be determined from known and/or measured controller parameters within local power controller 108. For example, one could use converter output currents for controller 108-A. Alternatively, and for example, one could perform current summing (via Kirchhoff's Law) at the nodes (e.g, ND-1 to ND-(N−1)) where the inductor currents (e.g., $I_{L-1}$ to $I_{L-(N-1)}$ for inductors L-1 to L-(N−1)) are function of the duty cycles (which are known within local interface 302) of the control signals applied to the switches within the differential network 110 (e.g., switch pairs SA-1,1/SA-1,2 to SA-(N−1),1/SA-(N−1),2 or switches SB-1,1/SB-1,2 to SB-N,1/SB-N,2). For example, an input vector that corresponds to inductor currents $I_{L-1}$ to $I_{L-(N-1)}$ for inductors L-1 to L-(N−1) can be:

$$\begin{bmatrix} I_{L-1} \\ \vdots \\ I_{L-(N-1)} \\ I_{MAIN} \end{bmatrix}, \quad (1)$$

where current $I_{MAIN}$ being the current output from the string to central converter 106, the matrix for this example can take the following form:

$$\begin{bmatrix} 1 & -(1-D_{S-2,1}) & 0 & \cdots & 0 & 0 & 0 \\ -D_{S-1,1} & 1 & -(1-D_{S-3,1}) & \cdots & 0 & 0 & 0 \\ 0 & -D_{S-2,1} & 1 & 0 & \vdots & \vdots & \vdots \\ 0 & 0 & -D_{S-3,1} & \ddots & -(1-D_{S-(N-1),1}) & 0 & 0 \\ \vdots & \vdots & \vdots & \ddots & 1 & -(1-D_{S-(N-1),1}) & 0 \\ 0 & 0 & 0 & \ddots & -D_{S-(N-1),1} & 1 & 0 \\ 0 & 0 & 0 & \cdots & 0 & D_{S-(N-1),1} & 1 \end{bmatrix} \quad (2)$$

Multiplication of the matrix of equation (2) by the input vector in equation (1) would then result in the output vector of:

$$\begin{bmatrix} I_{PV2} - I_{PV1} \\ \vdots \\ I_{PVN} - I_{PV(N-1)} \\ I_{PVN} \end{bmatrix} \quad (3)$$

This output vector of equation (3) can be transmitted from the form local monitor 304 to central monitor 206 (which can be and typically is in digital form). Alternatively, the local monitor 304 can transmit digital data to the central monitor 206 so that the central monitor 206 can perform the calculations. Local monitor 304 may also be equipped with an analog-to-digital converter (ADC) so as to digitize analog measurements from the local power controller 108. Based on this information, the health and general performance of each PV element (e.g., 102-1 to 102-N) can be easily and economically monitored from a centralized location. The local monitor 304 can also receive data from any number of controllers (e.g., DC/DC controllers 104-1 to 104-(N−1) or flyback controllers 108-1 to 108-N).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A method for determining a photovoltaic (PV) current from each of a plurality of PV elements arranged in a differential network, the method comprising:

controlling the differential network with a plurality of control signals, wherein the differential network includes a plurality of inductors, and wherein each control signal has a duty cycle;

receiving a plurality of controller parameters from a the plurality of differential controllers; and calculating the PV current for each of the plurality of PV elements from a the plurality of inductor currents and the duty cycle for each control signal wherein the step of calculating further comprises multiplying an input vector by a matrix so as to generate an output vector, wherein the input vector includes the plurality of digital inductor current measurements, and wherein matrix includes matrix elements corresponding to the duty cycle for each control signal used to control the differential network, and wherein the output vector includes the plurality of PV currents.

2. The method of claim 1, wherein the plurality of controller parameters further comprises a plurality of inductor current measurements, and wherein each inductor current measurement is associated with at least one of the plurality of inductors.

3. The method of claim 2, wherein the plurality of inductor current measurements further comprises a plurality of digital inductor current measurements, and wherein the method further comprises:

measuring the plurality of inductor currents to generate a plurality of analog inductor current measurements; and digitizing the plurality of analog inductor current measurements so as to generate the plurality of digital inductor current measurements.

4. The method of claim 1, wherein the step of controlling further comprises generating the plurality of control signals with a plurality of direct-current-to-direct-current (DC/DC) controllers.

5. The method of claim 4, wherein the steps of measuring and digitizing are performed by the plurality of DC/DC converters.

6. The method of claim 1, wherein the plurality of inductors further comprises a plurality of sets of inductors, and wherein the plurality of controller parameters further comprises a plurality of converter output current measurements.

7. The method of claim 6, wherein each set of inductor forms a transformer, and wherein the step of controlling further comprises generating the plurality of control signals with a plurality of flyback controllers, and wherein the steps of measuring and digitizing are performed by the plurality of flyback converters.

8. An apparatus comprising:
a local power controller that is configured to be coupled to a differential network having a plurality of inductors and a plurality of PV elements; and
a processor with a non-transitory memory having a computer program embodied thereon, the processor being coupled to the local power controller, and wherein the computer program product includes:
computer code for receiving a plurality of converter parameters for the differential network;
computer code for multiplying an input vector by a matrix so as to generate an output vector, wherein the vector includes the plurality of inductor current measurements, and wherein matrix includes matrix elements corresponding to a duty cycle for each control signal from the local power controller used to control the differential network, and wherein the output vector includes a plurality of PV currents, and wherein each PV current is associated with at least one of the plurality of PV elements; and
computer code for transmitting a digital signal to a monitoring network.

9. The apparatus of claim 8, wherein the plurality of converter parameters further comprises a plurality of digital inductor current measurements, and each inductor current measurement is associated with at least one of the plurality of inductors, and wherein the local power controller is configured to:
measure the plurality of inductor currents to generate a plurality of analog inductor current measurements; and
digitize the plurality of analog inductor current measurements so as to generate the plurality of digital inductor current measurements.

10. The apparatus of claim 9, wherein the local power controller further comprises a plurality of DC/DC controllers that are configured to generate the plurality of control signals.

11. The apparatus of claim 8, wherein the plurality of converter parameters further comprise a plurality of converter output current measurements, and wherein the plurality of inductors further comprises a plurality of sets of inductors, and wherein each set of inductor forms a transformer, and wherein the local power controller further comprises a plurality of flyback controllers that are configured to generate the plurality of control signals.

12. An apparatus comprising:
a central converter;
a differential network having:
a plurality of PV elements coupled in series with one another in a sequence, wherein the plurality of PV elements are coupled to one another at a plurality of intermediate nodes, and wherein a first and last PV elements of the sequence are coupled to the central converter;
a plurality of inductors; and
a plurality of pairs of switches;
a local power controller that is coupled to the differential network so as to control each of the pairs of switches, and wherein the local power controller, the plurality of inductors and the plurality of pairs of switches are arranged to form a plurality of differential converters; and
a monitor that is coupled to the local power controller, wherein the monitor is configured to:
receive a plurality of converter parameters for the differential network;
multiply an input vector by a matrix so as to generate an output vector, wherein the input vector includes a plurality of inductor current measurements, and wherein the matrix includes matrix elements corresponding to a duty cycle for each control signal from the local power controller used to control the differential network, and wherein the output vector includes a plurality of PV currents, and wherein each PV current is associated with at least one of the plurality of PV elements; and
transmit a digital signal to a monitoring network.

13. The apparatus of claim 12, wherein the plurality of converter parameters further comprises a plurality of digital inductor current measurements, and each inductor current measurement is associated with at least one of the plurality of inductors, and wherein the local power controller is configured to:
measure the plurality of inductor currents to generate a plurality of analog inductor current measurements; and
digitize the plurality of analog inductor current measurements so as to generate the plurality of digital inductor current measurements.

14. The apparatus of claim 13, wherein each inductor is coupled to at least one of the intermediate nodes, and wherein each pair of switches has a switching node, and wherein each switching node is coupled to at least one of the inductors.

15. The apparatus of claim 14, wherein the local power controller further comprises a plurality of DC/DC controllers that are configured to generate the plurality of control signals.

16. The apparatus of claim 12, wherein the plurality of inductors further comprises a plurality of sets of inductors.

17. The apparatus of claim 16, wherein the plurality of converter parameters further comprise a plurality of converter output current measurements, and wherein each set of inductor forms a transformer, and wherein the local power controller further comprises a plurality of flyback controllers that are configured to generate the plurality of control signals.

18. The apparatus of claim 12, wherein the monitor is a processor with a non-transitory memory having a computer program embodied thereon.

19. The apparatus of claim 12, wherein the central converter further comprise a direct-current-to-alternating-current (DC/AC) converter.

* * * * *